United States Patent
Sullivan-Malervy et al.

(10) Patent No.: US 9,112,002 B2
(45) Date of Patent: Aug. 18, 2015

(54) ELECTRICAL CONDUCTORS AND METHODS OF MANUFACTURING ELECTRICAL CONDUCTORS

(75) Inventors: Mary Elizabeth Sullivan-Malervy, Downingtown, PA (US); Robert Daniel Hilty, Harrisburg, PA (US); Rodney I. Martens, Mechanicsburg, PA (US); Min Zheng, Harrisburg, PA (US); Jessica Henderson Brown Hemond, Mifflintown, PA (US); Zhengwei Liu, Herhsey, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 366 days.

(21) Appl. No.: 13/372,155

(22) Filed: Feb. 13, 2012

(65) Prior Publication Data

US 2013/0206461 A1    Aug. 15, 2013

(51) Int. Cl.
*H05K 1/09* (2006.01)
*H01L 21/768* (2006.01)
*B82Y 30/00* (2011.01)
*C23C 16/02* (2006.01)
*C23C 16/26* (2006.01)
*H01L 23/532* (2006.01)

(52) U.S. Cl.
CPC ............ *H01L 21/7685* (2013.01); *B82Y 30/00* (2013.01); *C23C 16/0272* (2013.01); *C23C 16/26* (2013.01); *H01L 23/53238* (2013.01); *H01L 2924/0002* (2013.01)

(58) Field of Classification Search
None
See application file for complete search history.

(56) References Cited

U.S. PATENT DOCUMENTS

| 2003/0211724 | A1* | 11/2003 | Haase ............................. 438/629 |
| 2004/0182600 | A1* | 9/2004 | Kawabata et al. ............ 174/250 |
| 2010/0203340 | A1 | 8/2010 | Ruoff et al. |
| 2011/0006425 | A1 | 1/2011 | Wada et al. |
| 2011/0151278 | A1 | 6/2011 | Gurney et al. |
| 2011/0198558 | A1 | 8/2011 | Okai et al. |

FOREIGN PATENT DOCUMENTS

WO    2011/074987 A1    6/2011

OTHER PUBLICATIONS

Loyd et al.: "A Preliminary Investigation of Graphite, Graphene and Carbon Nanotubes as Solid State Lubricants", Proceedings of the 2011 IEEE 57th Holm Conference on Electrical Contacts, Sep. 11, 2011-Sep. 14, 2011, pp. 1-9.
International Search Report issued in related PCT application No. PCT/US2013/022885 on May 23, 2013.

* cited by examiner

*Primary Examiner* — Joseph Miller, Jr.

(57) ABSTRACT

A method of manufacturing an electrical conductor includes providing a substrate layer, depositing a surface layer on the substrate layer that has pores at least partially exposing the substrate layer, and forming graphene deposits in the pores. Optionally, the graphene deposits may be formed only in the pores. The graphene deposits may be formed along the exposed portions of the substrate layer. The graphene layers may be selectively deposited or may be deposited to cover an entire layer. Optionally, the forming of the graphene deposits may include processing the electrical conductor using a chemical vapor deposition process using an organic compound precursor and heat of sufficient temperature to facilitate graphene growth on the metal compound comprising the substrate layer.

4 Claims, 3 Drawing Sheets

ELECTRICAL CONDUCTORS AND METHODS OF MANUFACTURING ELECTRICAL CONDUCTORS

BACKGROUND OF THE INVENTION

The subject matter herein relates generally to methods of manufacturing electrical conductors.

Electrical conductors have many forms, such as a contact, a terminal, a pin, a socket, an eye-of-needle pin, a micro-action pin, a compliant pin, a wire, a cable braid, a trace, a pad and the like. Such electrical conductors are used in many different types of products or devices, including electrical connectors, cables, printed circuit boards, and the like. The metals used in the electrical conductors are susceptible to corrosion, diffusion or other reactions, limiting their use or requiring protective coatings. For example, when copper or copper alloy electrical conductors are used, such conductors are susceptible to corrosion. A gold surface layer is typically applied to the copper as a corrosion inhibitor. However, the gold and copper materials suffer from diffusion and typically a diffusion barrier, such as nickel is deposited between the copper and gold layers.

Corrosion of base metals is detrimental to the conductor interface and signal integrity. Current plating methods used to mitigate corrosion often leave a porous surface, resulting in oxidation and corrosion of the underlying surface. Additionally, some surface layers suffer from problems associated with friction, stiction and other contact forces, limiting application of the conductors.

A need remains for an electrical conductor that addresses the aforementioned problems and other shortcomings associated with traditional electrical conductors.

BRIEF DESCRIPTION OF THE INVENTION

In one embodiment, a method of manufacturing an electrical conductor is provided including providing a substrate layer, depositing a surface layer on the substrate layer that has pores at least partially exposing the substrate layer, and forming graphene deposits in the pores. Optionally, the graphene deposits may be formed only in the pores. The graphene deposits may also be formed along any exposed portions of the substrate layer.

Optionally, the formed graphene deposits may include processing the electrical conductor using a chemical vapor deposition (CVD) process using an organic compound precursor and heat of sufficient temperature to facilitate graphene growth on the metal compound comprising the substrate layer. The chemical vapor deposition process may use methane at a temperature that promotes graphene growth on the exposed substrate layer. The forming of the graphene deposits may include subjecting the electrical conductor to conditions having a preference for graphene growth on the substrate layer as compared to the surface layer. The forming of the graphene deposits may include depositing a graphene layer between the substrate layer and the surface layer that spans across the pores.

Optionally, the providing a substrate layer may include providing a base substrate layer of copper or copper alloy and providing a barrier substrate layer of nickel or nickel alloy that has pores exposing the base substrate layer. The graphene deposits may be formed in the pores of the barrier substrate layer along the base substrate layer. The forming of the graphene deposits may include using the metal compound of the substrate layer as a catalyst for graphene growth in the presence of an organic compound and high temperature.

In another embodiment, a method of manufacturing an electrical conductor includes providing a base substrate layer. The method includes depositing a barrier substrate layer on the base substrate layer that has a different metal or metal alloy than the base substrate layer. The barrier substrate layer has pores at least partially exposing the base substrate layer. The method includes depositing a surface layer on the barrier substrate layer to define a workpiece. The surface layer has pores at least partially exposing the barrier substrate layer. The method includes performing a chemical vapor deposition process on the workpiece using an organic compound precursor and heat to form a graphene deposit in the pores on at least one of the exposed portion of the barrier substrate layer and the exposed portion of the base substrate layer.

In a further embodiment, an electrical conductor is provided having a substrate layer of at least one of copper, copper alloy, nickel, or nickel alloy with a surface layer of at least one of gold, silver, tin, palladium-nickel or alloy of such with a continuous graphene layer between the substrate layer and the surface layer. Optionally, the surface layer may include pores and the graphene layer may be located within the pores of that layer or cover the layer. It may also be located between the surface and/or barrier substrate layers. The graphene layer may define graphene deposits located in the pores. The substrate layer may include a base substrate layer and a barrier substrate layer having pores, where the graphene layer defines graphene deposits located in the pores or preferential to either the base substrate or the barrier layer. A continuous graphene layer may be directly between the surface layer and the substrate layer to define a diffusion barrier between the surface layer and the substrate layer. Alternately, multiple graphene layers may be found between the base substrate, barrier layer and surface layers.

DETAILED DESCRIPTION OF THE INVENTION

Figure 1:
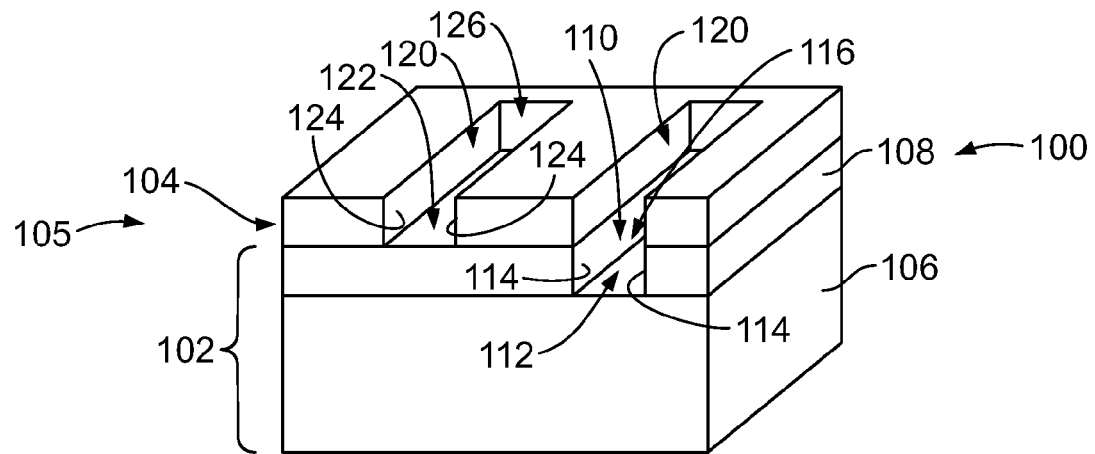
FIG. 1 is a cross sectional view of a portion of an electrical conductor formed in accordance with an exemplary embodiment.

FIG. 1 is a cross sectional view of a portion of an electrical conductor 100 formed in accordance with an exemplary embodiment. The electrical conductor 100 may be any type of electrical conductor, such as a contact, a terminal, a pin, a socket, an eye-of-the-needle pin, a micro-action pin, a compliant pin, a wire, a cable braid, a trace, a pad and the like. The electrical conductor 100 may form part of an electrical connector, a cable, a printed circuit board and the like.

In an exemplary embodiment, the electrical conductor 100 is a multi-layered structure having a substrate layer 102 and a surface layer 104 that together define a workpiece 105. The workpiece 105 is processed to form graphene on select layers and/or at select locations of the workpiece 105 to enhance the performance of the electrical conductor, The surface layer 104 provides a corrosion-resistant electrically conductive layer on the substrate layer 102. For example, the surface layer 104 may include a metal compound such as gold, silver, tin, palladium, nickel, palladium-nickel, platinum and the like. The surface layer 104 is generally a thin layer. The surface layer 104 may be deposited on the substrate layer 102 by any known process, such as plating. Optionally, the surface layer 104 may be deposited directly on the underlying substrate layer 102. Alternatively, one or more other layers may be provided between the surface layer 104 and the substrate layer 102, such as a graphene layer.

The substrate layer 102 may be a multi-layered structure. In the illustrated embodiment, the substrate layer 102 includes a base substrate layer 106 and a barrier substrate layer 108 deposited on the base substrate layer 106. Optionally, the base substrate layer 106 and/or the barrier substrate layer 108 may be a multi-layered structure. The surface layer 104 and the substrate layers 102 together define a stackup of layers. The graphene may be provided at any or all interfaces between the layers and/or at select locations of the stackup to enhance the performance of the electrical conductor.

In an exemplary embodiment, the base substrate layer 106 is electrically conductive and includes a metal compound, such as a copper or a copper alloy. Other metal compounds for the base substrate layer 106 may include nickel, nickel alloy, steel, steel allow, aluminum, aluminum alloy, palladium-nickel, tin, tin alloy, cobalt, carbon, graphite, graphene, carbon-based fabric, or any other conductive material. The barrier substrate layer 108 is electrically conductive and includes a metal compound, such as nickel or a nickel alloy. Other metal compounds for the barrier substrate layer 108 include other metal or conductive material such as copper, gold, silver, cobalt, tungsten, platinum, palladium, or alloys of such. The barrier substrate layer 108 provides a diffusion barrier between the base substrate layer 106 and the surface layer 104, such as when such layers are copper and gold or other metal compounds that have diffusion problems. The barrier substrate layer 108 provides mechanical backing for the surface layer 104, which may be relatively thin, improving its wear resistance. The barrier substrate layer 108 reduces the impact of pores present in the surface layer 104. The barrier substrate layer 108 may be deposited on the base substrate layer 106 by any known process, such as plating. Optionally, the barrier substrate layer 108 may be deposited directly on the underlying base substrate layer 106. Alternatively, one or more other layers may be provided between the barrier substrate layer 108 and the base substrate layer 106, such as a graphene layer.

The barrier substrate layer 108 may include pores 110 that expose the base substrate layer 106. The pores 110 are formed during the depositing process. For example, the pores 110 may form at triple points or grain boundaries of the base substrate layer 106. The pores 110 expose the base substrate layer 106, which may lead to corrosion of the base substrate layer 106 if left exposed. The pores 110 have a bottom 112, exposing the base substrate layer 106, and sides 114 extending from the bottom 112 to a top 116 of the barrier substrate layer 108 (the terms bottom and top are relative to a particular orientation of the electrical conductor and more generally constitute interior and exterior, respectively). The sides 114 are exposed within the pores 110. While the pores 110 are represented graphically in FIG. 1 as being rectangular, it is realized that the pores 110 may have any shape. For example, the sides 114 may be non-planar and may be irregular in shape.

The surface layer 104 may include pores 120 that expose the substrate layer 102. The pores 120 may be formed during the depositing process. For example, the pores 120 may form at the pores 110. The pores 120 expose the substrate layer 102, which may lead to corrosion if left exposed. The pores 120 have an open bottom 122 along the interface between the surface layer 104 and the substrate layer 102. The pores 120 have sides 124 extending from the bottom 122 to a top 126 of the surface layer 104. The sides 124 are exposed within the pores 120.

Figure 2:
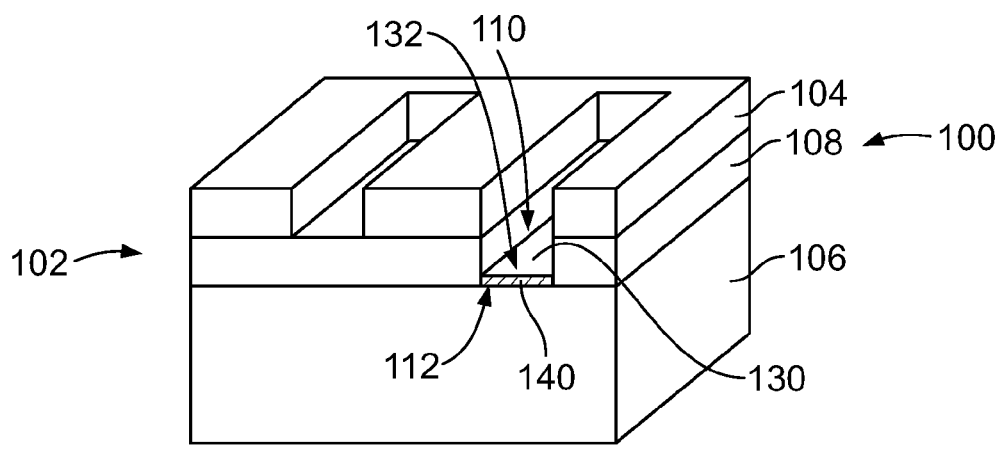
FIG. 2 is a cross sectional view of a portion of the electrical conductor with graphene barriers.

FIG. 2 is a cross sectional view of a portion of the electrical conductor 100 with graphene barriers 130 to inhibit corrosion. The graphene barriers 130 may be electrically conductive. The graphene barriers 130 are deposited on the substrate layer 102. In the illustrated embodiment, the graphene barriers 130 are provided on the base substrate layer 106 to inhibit corrosion of the base substrate layer 106 (e.g. copper layer). In an exemplary embodiment, the graphene barriers 130 are grown on the exposed portion of the base substrate layer 106. For example, the electrical conductor 100 is processed to grow the graphene barriers 130 in select locations (e.g. on the exposed base substrate layer 106). The graphene barriers 130 constitute graphene deposits, generally indicated by reference numeral 132. The graphene deposits 132 plug the pores 110, 120. The graphene deposits 132 cover the bottoms 112 of the pores 110 below the pores 120. The graphene deposits 132 may constitute plugs for the pores and may be referred to hereinafter as plugs 132.

In an exemplary embodiment, the graphene barriers 130 may be formed during a chemical vapor deposition (CVD) process in the presence of an organic compound, such as gaseous methane, at a high temperature, such as approximately 800° C. Deposition mechanisms may also include electron beam, microwave or other process within the vaporous atmosphere. Other processes may be used to deposit the graphene barriers 130, such as laser deposition, plasma deposition or other techniques or processes. Optionally, the graphene barriers 130 may be 1 atomic layer thick on the base substrate layer 106. Alternatively, the graphene barriers 130 may be thicker. The graphene barriers 130 provide corrosion resistance.

The graphene barriers 130 may be deposited only on the exposed portions of the base substrate layer 106. For example, the metal compound of the base substrate layer 106 may be used as a catalyst during the CVD process (or other process) to promote graphene growth at the interface with the base substrate layer 106 as compared to other layers, such as the barrier substrate layer 108 or the surface layer 104. Optionally, the CVD process may be controlled to promote graphene growth at such interface as opposed to interfaces with other metal compounds. For example, the type of organic compound or gas precursor used, the pressure of the gas precursor used, the flow rate of the gas precursor, the temperature of the process, or other factors may promote graphene growth on one metal as compared to other metals. As such, the graphene barriers 130 may be selectively deposited on the electrical conductor 100 as opposed to a blanket covering of the entire electrical conductor 100, or particular layer of the electrical conductor 100.

In alternative embodiments, the CVD process may be controlled to promote graphene growth on more than one type of metal as compared to other types of metals. For example, the CVD process may be controlled to promote graphene growth on copper and nickel, but not gold, such that the exposed portions of the barrier substrate layer 108 and the base substrate layer 106 in the pores 110 are covered by graphene, but the surface layer 104 is not covered by graphene. Such embodiment is shown in more detail in FIG. 3.

Figure 3:
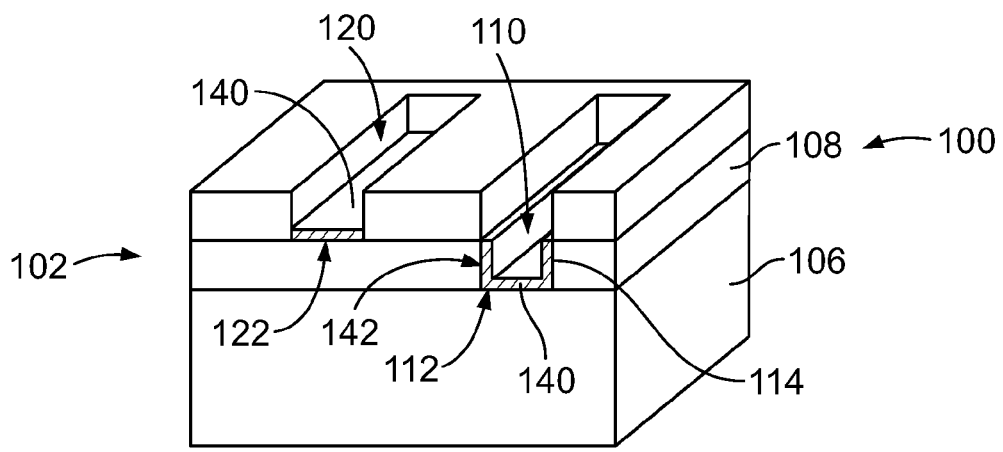
FIG. 3 is a cross sectional view of a portion of the electrical conductor with graphene barriers.

FIG. 3 is a cross sectional view of a portion of the electrical conductor 100 with graphene barriers 140 to inhibit corrosion. The graphene barriers 140 may be electrically conductive. The graphene barriers 140 are deposited on the substrate layer 102. In the illustrated embodiment, the graphene barriers 140 are provided on the base substrate layer 106 and/or the barrier substrate layer 108 to inhibit corrosion, The graphene barriers 140 are grown on the exposed portion of the base substrate layer 106 and the barrier substrate layer 108. For example, the graphene barriers 140 are grown on the sides 114 of the pores 110 and the bottom 122 of the pores 120 along the barrier substrate layer 108 to grow the graphene barriers 140 in select locations. The graphene barriers 140 constitute graphene deposits, generally indicated by reference numeral 142. The graphene deposits 142 plug the pores 110. The graphene deposits 142 cover the bottoms 112 of the pores 110. The graphene deposits 142 may be formed in a similar manner as the graphene deposits 132 (shown in FIG. 2). Optionally, the graphene deposits 142 may entirely fill the pores 110 and/or 120. The graphene deposits 142 may constitute plugs for the pores and may be referred to hereinafter as plugs 142.

Figure 4:
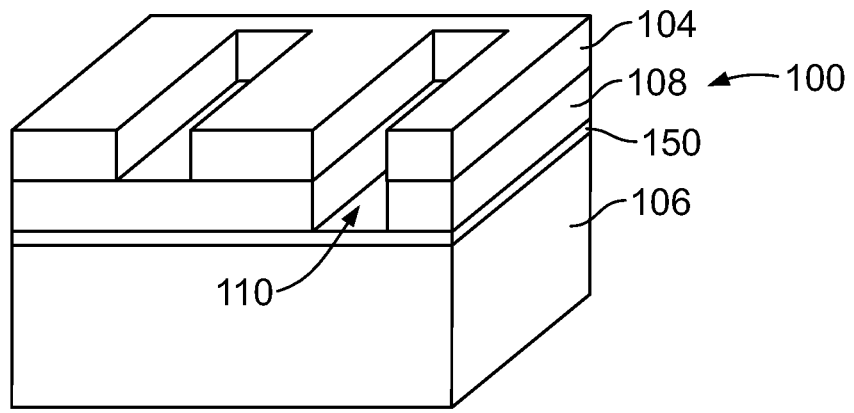
FIG. 4 illustrates the electrical conductor having graphene barriers.
Figure 5:
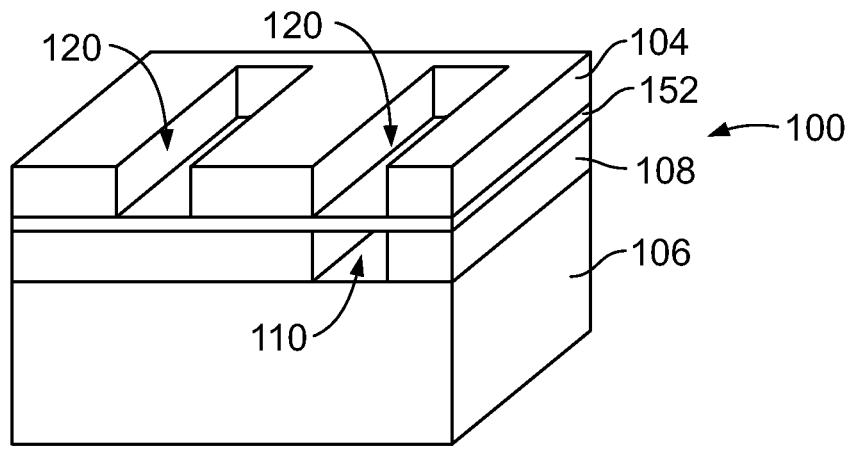
FIG. 5 illustrates the electrical conductor having graphene barriers.
Figure 6:
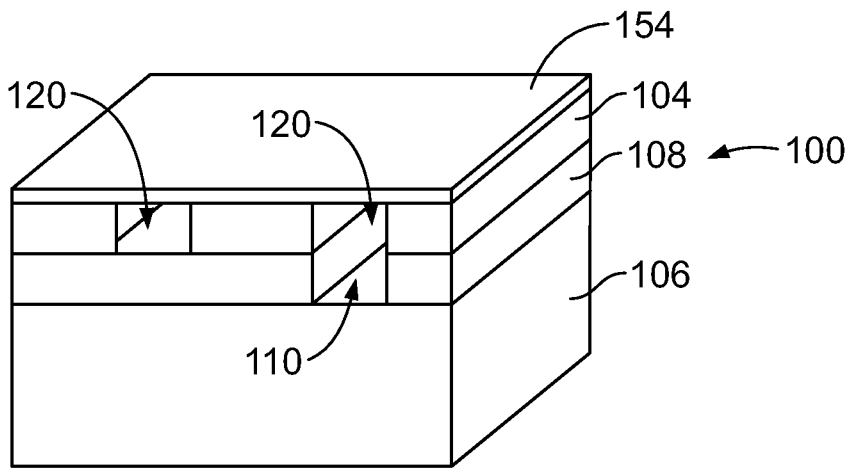
FIG. 6 illustrates the electrical conductor having graphene barriers.

In alternative embodiments, the electrical conductor 100 may include graphene layers that cover the entire surfaces of one or more layers in addition to having the graphene deposits 132 or 142 or as an alternative to having the graphene deposits 132 or 142. FIG. 4 illustrates the electrical conductor 100 having a graphene layer 150 deposited on the base substrate layer 106 between the base substrate layer 106 and the barrier substrate layer 108. FIG. 5 illustrates the electrical conductor 100 having a graphene layer 152 deposited on the barrier substrate layer 108 between the barrier substrate layer 108 and the surface layer 104. FIG. 6 illustrates the electrical conductor having a graphene layer 154 deposited on the surface layer 104. The graphene layers 150, 152, 154 define graphene barriers. Optionally, the electrical conductor 100 may include more than one graphene layer, such as the graphene layers 150 and 152, the graphene layers 150 and 154, the graphene layers 152 and 154 or the graphene layers 150, 152 and 154.

In an exemplary embodiment, the graphene layers 150, 152, 154 entirely cover the top surfaces of the base substrate layer 106, the barrier substrate layer 108 and the surface layer 104, respectively. The pores 110 in the barrier substrate layer 108 expose the graphene layer 150. The pores 120 in the surface layer 104 expose the graphene layers 150 and/or 152. The graphene layer 154 covers the pores 120 and/or 110. The exposed portions of the graphene layers operate as corrosion barriers for the electrical conductor 100 by providing a barrier between the base substrate layer 106 and the environment to inhibit oxygen atoms from interacting with the metal compounds of the base substrate layer 106.

In an exemplary embodiment, the graphene layers 150, 152 operate as diffusion barriers to inhibit diffusion between the base substrate layer 106 and the surface layer 104. Optionally, the graphene layer 150 may replace the barrier substrate layer 108, acting as the diffusion barrier between the base substrate layer 106 and the surface layer 104.

In an exemplary embodiment, the graphene layer 154 is the outermost layer of the electrical conductor 100. The graphene layer 154 may reduce friction on the outermost surface of the electrical conductor 100, which may make mating of the electrical conductor 100 easier. The graphene layer 154 may reduce stiction of the surface layer 104. The reduction in stiction may allow use of the electrical conductor 100 in fields or devices that previously were unsuitable for electrical conductors 100 having problems with stiction and/or cold welds, such as electrical conductors having the outermost layer being a gold layer. For example, in microelectromechanical systems (MEMS) switches, stiction is a problem when a gold layer is the outermost layer of the electrical conductor. Coating the surface layer 104 with the graphene layer 154 reduces the stiction of the electrical conductor 100, making the electrical conductor suitable for use in MEMS switches.

The graphene layers 152, 154 cover the pores 110, 120, respectively. Optionally, the graphene layers 152, 154 may at least partially fill the pores 110 and/or 120. The graphene layers 152, 154 may define graphene deposits that at least partially plug the pores 110 and/or 120.

Figure 7:
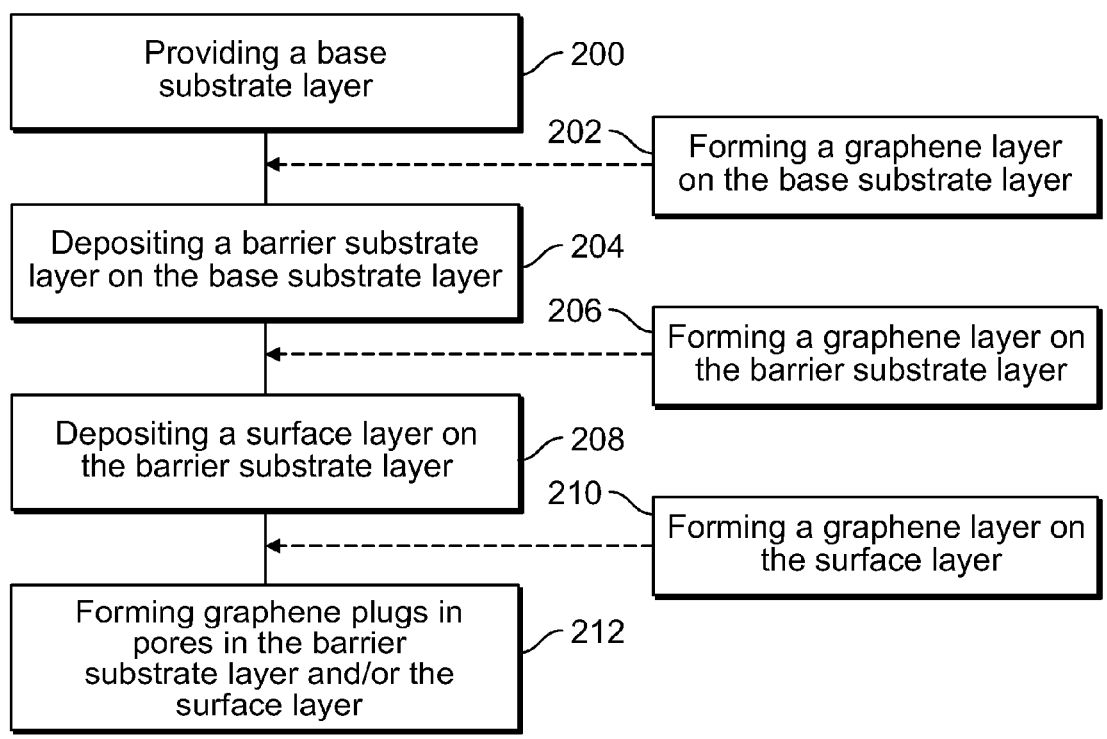
FIG. 7 is a flow chart showing an exemplary method of manufacture of an electrical conductor.

FIG. 7 is a flow chart showing an exemplary method of manufacture of an electrical conductor, such as the electrical conductor 100. The method includes providing 200 a base substrate layer, such as the base substrate layer 106. The base substrate layer may be a copper or copper alloy layer.

Optionally, the method may include forming 202 a graphene layer, such as the graphene layer 150, on the base substrate layer. The graphene layer may be formed by a CVD process or another process. The graphene layer may completely cover the base substrate layer or may selectively cover portions of the base substrate layer. The graphene layer may be formed by growing or depositing one or more graphene layers on the base substrate layer. The base substrate layer may act as a catalyst to promote selective growth of the graphene thereon.

The method includes depositing 204 a barrier substrate layer, such as the barrier substrate layer 108, on the base substrate layer. The barrier substrate layer may be directly deposited on the base substrate layer. Alternatively, one or more other layers, such as the graphene layer, may be layered between the barrier substrate layer and the base substrate layer. The barrier substrate layer may be deposited by plating or by other known processes that apply the barrier substrate layer on the base substrate layer.

Optionally, the method may include forming 206 a graphene layer, such as the graphene layer 152, on the barrier substrate layer. The graphene layer may be formed by a CVD process or another process. The graphene layer may completely cover the barrier substrate layer or may selectively cover portions of the barrier substrate layer. The graphene layer may cover any pores in the barrier substrate layer. The graphene layer may at least partially fill any pores in the barrier substrate layer. The graphene layer may be formed by growing or depositing one or more graphene layers on the barrier substrate layer. The barrier substrate layer may act as a catalyst to promote growth of the graphene thereon.

The method includes depositing 208 a surface layer, such as the surface layer 104, on the barrier substrate layer. The surface layer may be directly deposited on the surface layer. Alternatively, one or more other layers, such as the graphene layer 152, may be layered between the barrier substrate layer and the surface layer. The surface layer may be deposited by plating or by other known processes that apply the surface layer on the barrier substrate layer.

Optionally, the method may include forming 210 a graphene layer, such as the graphene layer 154, on the surface layer. The graphene layer may be formed by a CVD process or another process. The graphene layer may completely cover the surface layer or may selectively cover portions of the surface layer. The graphene layer may cover any pores in the surface layer. The graphene layer may at least partially fill any pores in the surface layer. The graphene layer may be formed by growing one or more graphene layers on the surface layer. The surface layer may act as a catalyst to promote growth of the graphene thereon.

The method includes forming 212 graphene deposits, such as the graphene deposits 132 and/or 142, in the pores in the barrier substrate layer and/or the pores in the surface layer. The graphene deposits may be formed by a CVD process or another process. For example, the workpiece defined by the various layers of the electrical conductor is processed to form the graphene in select areas. The graphene deposits may be formed on the exposed metal of the barrier substrate layer and/or the base substrate layer in the pores in the barrier substrate layer. The graphene deposits may completely cover the exposed portion of the base substrate layer and/or the sides of the pores in the barrier substrate layer. The graphene deposits may at least partially fill any pores in the barrier substrate layer. The graphene deposits may be formed by growing one or more graphene layers on the exposed metal of the substrate layer(s). The exposed metal may act as a catalyst to promote growth of the graphene thereon as compared to the exposed metal of the surface layer.

In an exemplary embodiment, the graphene of the layers or the deposits are formed during a CVD process in the presence of an organic compound, such as gaseous methane, at a high temperature, such as approximately 800° C. The location of the graphene growth may be controlled, such as by using certain metals as catalysts to promote growth where such metals are exposed. For example, the metal exposed in the pores may be used as the catalyst to promote graphene growth at such interfaces as compared to other layers that do not have such metals exposed. The type of organic compound or gas precursor used, the pressure of the gas precursor used, the flow rate of the gas precursor, the temperature of the process, or other factors may promote graphene growth on one metal as compared to other metals.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A method of manufacturing an electrical conductor, the method comprising:
   providing a substrate layer, wherein said providing a substrate layer comprises:
      providing a base substrate layer of copper or copper alloy; and
      providing a barrier substrate layer of nickel or nickel alloy, the barrier substrate layer having pores exposing the base substrate layer,
   depositing a surface layer on the substrate layer, the surface layer having pores at least partially exposing the substrate layer; and
   forming graphene deposits in the pores of the barrier substrate layer onto the base substrate layer.

2. The method of claim 1, wherein the graphene deposits are formed only in the pores.

3. A method of manufacturing an electrical conductor comprising a contact, a terminal, a pin, a socket, an eye-of-the-needle pin, a micro-action pin, a compliant pin, a wire, a cable braid, a trace, or a pad, the method comprising:
   providing a substrate layer of the electrical conductor, wherein said providing a substrate layer comprises providing a base substrate layer and providing a barrier substrate layer on the base substrate layer, the barrier substrate layer having pores exposing the base substrate layer;
   depositing a surface layer on the substrate layer, the surface layer having pores at least partially exposing the substrate layer, wherein at least some of the pores of the barrier substrate layer are aligned with at least some of the pores of the surface layer to expose the base substrate layer; and
   forming graphene deposits in the pores, wherein said forming graphene deposits comprises performing a chemical vapor deposition process subjecting the electrical conductor to conditions having a preference for graphene growth on the base substrate layer as compared to the barrier substrate layer.

4. The method of claim 3, wherein the graphene deposits are formed only in the pores.

* * * * *